United States Patent [19]

Baer

[11] Patent Number: 4,908,832
[45] Date of Patent: * Mar. 13, 1990

[54] HIGH EFFICIENCY MODE-MATCHED SOLID-STATE LASER WITH TRANSVERSE PUMPING

[75] Inventor: Thomas M. Baer, Mountain View, Calif.

[73] Assignee: Spectra-Physics, Inc., San Jose, Calif.

[ * ] Notice: The portion of the term of this patent subsequent to Nov. 15, 2005 has been disclaimed.

[21] Appl. No.: 314,655

[22] Filed: Feb. 23, 1989

Related U.S. Application Data

[63] Continuation-in-part of Ser. No. 231,192, Aug. 11, 1988, which is a continuation of Ser. No. 103,557, Sep. 30, 1987, Pat. No. 4,785,459, which is a continuation-in-part of Ser. No. 35,530, Apr. 7, 1987, Pat. No. 4,756,003, which is a continuation-in-part of Ser. No. 811,546, Dec. 19, 1985, Pat. No. 4,656,635, which is a continuation-in-part of Ser. No. 730,002, May 1, 1985, Pat. No. 4,653,056.

[51] Int. Cl.$^4$ .............................................. H01S 3/091
[52] U.S. Cl. ........................................ 372/75; 372/34; 372/101; 372/92; 372/70
[58] Field of Search .................. 372/75, 34, 101, 92, 372/69, 98, 71, 108, 70

[56] References Cited

U.S. PATENT DOCUMENTS 4,710,940 12/1987 Sipes, Jr. .............................. 372/69

Primary Examiner—Léon Scott, Jr.
Attorney, Agent, or Firm—Lyon & Lyon

[57] ABSTRACT

A high efficiency pumping scheme mode matches the TEMOO laser mode volume with a plurality of spaced apart laser diode pumping sources positioned along a lateral side of a block of laser material. The cavity resonator within the block is configured in a tightly folded zig-zag configuration. Pump radiation from the diode pumping sources is collimated by an optical fiber and is optically coupled to the verticies of the zig-zags. The fold angle less than 20° and preferably less than 10° and is selected to mode match the pump radiation to the mode volume. Parasitic oscillation across the laser block are prevented.

In an alternate embodiment the pumping sources are separated from the block of laser material and are optically coupled to the block by the use of a lens. In a second alternate embodiment, the pumping sources are separated from the block of laser material and are optically coupled to the block by means of a plurality of optical fibers.

35 Claims, 7 Drawing Sheets

HIGH EFFICIENCY MODE-MATCHED SOLID-STATE LASER WITH TRANSVERSE PUMPING

RELATED APPLICATIONS

This application is a CIP of Ser. No. 231,192, filed Aug. 11, 1988, which is a continuation of Ser. No. 103,557, filed Sept. 30, 1987, which is a CIP of Ser. No. 035,530, filed Apr. 7, 1987, which is a CIP of Ser. No. 811,546 filed Dec. 19, 1985, now U.S. Pat. No. 4,656,635, issued Apr. 7, 1987, which is a CIP of Ser. No. 730,002 filed May 1, 1985, now U.S. Pat. No. 4,653,056, issued Mar. 24, 1987.

BACKGROUND OF THE INVENTION

The invention relates generally to resonator cavity designs for solid-state lasers and more particularly to resonator cavity designs for diode-pumped solid-state lasers.

Conventional optically-pumped solid-state lasers utilize broadband arc lamps or flashlamps to laterally or transversely pump the solid-state laser medium in a resonant cavity. The direction of pumping is transverse or orthogonal to the longitudinal axis of the resonant cavity. The entire medium is pumped so there is little correspondence between the pump volume and the TEMOO mode volume defined by the laser cavity; operation in TEMOO mode is desired. Much of the energy goes into regions of the medium outside the volume occupied by the laser mode and therefore does not contribute to amplification of the laser beam. Thus pumping efficiency is low (typically a few percent).

Laser diodes form efficient pumping sources; a variety of different types of laser diodes, particularly laser diode arrays, e.g. Spectra Diode Labs Model No. 2410 GaAlAs laser diode array, in which a plurality of emitters are phase locked together, and extended emitter laser diodes, e.g. Sony Model Nos. SLD 301, 302, 303, 304 V/W, have been or can be used. U.S. Pat. Nos. 4,653,056 and 4,656,635 and patent applications Ser. Nos. 029,836 filed Mar. 24, 1987 and 035,530, filed Apr. 7, 1987 describe a solid-state laser longitudinally end pumped by a laser diode source in which the pump volume is matched to the desired TEMOO mode volume to optimize pumping efficiency. In the longitudinal end pump configuration, the direction of pumping coincides with the longitudinal axis of the resonator cavity, and thus can be matched into the laser mode volume. U.S. Pat. No. 4,665,529, issued May 12, 1987 and patent application Ser. No. 048,717 filed May 12, 1987 describe a solid-state laser in which a laser diode source is coupled to a laser rod by means of an optical fiber to longitudinally end pump and mode match the laser. It is desirable to produce small size, low cost, high performance solid-state lasers.

Thus the resonator/pump configuration is a key feature of laser design and performance. Lateral pumping schemes do not provide mode matching and are therefore inefficient. End pumping schemes using laser diodes provide mode matching and consequently high efficiency. However, previously-available laser diodes have often been limited in power, usually under 1W. Furthermore, even with higher power laser diode sources, the end pumped configuration limits the amount of energy that can be used, thereby limiting the power of the laser, since the power densities in the pump region of the gain medium become too high and the heat produced cannot be removed. Accordingly, it is desirable to provide a resonator configuration which combines a transverse or lateral pump geometry with mode matching of the pump volume to the TEMOO mode volume since lateral pumping allows more energy to be input into the medium while mode matching uses the pump energy more effectively.

Another type of laser diode is a plurality of laser diode arrays fabricated into a multi-element bar structure. These laser diode array bars typically have ten 1W laser diode arrays spaced along a 1 cm bar; each array has multiple emitters phase locked together. These array bars are not suitable for end pumping a solid-state laser but could be useful for transversely or laterally pumping a solid-state laser. However, if the bars are used as mere substitutes for arc lamps, little benefit will be derived. Accordingly, it is necessary to develop a laser resonator/pump configuration in which the output of the laser diode array bar can be mode-matched to a desired mode volume (TEMOO) within the solid-state laser material.

SUMMARY OF THE INVENTION

Accordingly it is an object of the invention to provide a mode-matched transverse laser diode-pumped solid-state laser.

It is also an object of the invention to provide a mode-matched solid-state laser pumped by a laser diode array bar.

It is a further object of the invention to provide a solid-state laser resonator configuration which provides for efficient mode-matched pumping by a multi-element laser diode pump source.

It is another object of the invention to provide a mode matched laser diode pumped solid state laser which is pumped from a lateral side of the gain medium.

It is also an object of the invention to provide a solid-state laser which in which a plurality of laser diode pump sources spaced along a lateral side of the gain medium are mode matched to the TEMOO mode.

The invention is a solid-state laser pumped by a plurality of discrete laser diode pump sources extending along a transverse or lateral face of a block of laser material which are mode-matched to the resonator mode volume. Preferably, the pump source is a plurality of laser diode arrays which have been fabricated into a multi-element bar structure. Efficient optical pumping of the solid-state lasers is accomplished by mode matching the array output to the TEMOO mode within the solid-state laser material in a tightly folded zig-zag cavity configuration. By configuring the resonator in a tightly folded zig-zag between a pair of transverse or lateral sides of the gain medium, the pump radiation can be directed longitudinally into the mode volume, i.e., a transverse longitudinal pump scheme is achieved. Mode matching is accomplished by matching the cavity mode volume to the divergence of the laser diode emission. A cylindrical collimating lens, preferably a length of optical fiber, is mounted parallel to and in a spaced relation with the diode bar by precision spacer means to substantially collimate the diode emission in one direction (normal to the diode bar-laser gain medium junction). The diameter of the fiber is chosen to match the pumped region to the size of the laser mode. In the other direction (in the resonator plane) the divergence of the laser diode emission (often a two lobe pattern) is matched to the fold angle of the zig-zag path of the TEMOO beam through the block of solid-state laser material. The fold angle is less than about 20°, and preferably less than 10°.

In a first alternate embodiment of the invention the diode pump sources are separated from the bar of solid state laser material and a lens is placed between them to focus the pump radiation onto the surface of the diode bar.

In a second alternate embodiment, a plurality of laser diode pumping sources are optically coupled to the bar of solid state laser material by means of optical fibers.

DETAILED DESCRIPTION OF THE PREFERRED EMBODIMENTS:

The invention is a solid-state laser having a resonator/pump geometry which provides effective coupling of high average power laser diode bars to the solid-state laser active medium. The invention utilizes a laser cavity having a tightly folded zig-zag configuration within a block of laser material so that a laser diode bar placed along a transverse or lateral face of the block of laser material can be mode-matched to the TEM00 mode volume. This solid-state laser oscillator optimizes the overlap between the lasing TEM00 mode and the regions pumped by the diode bar, using optional simple collimating optics and the fold angle of the resonator cavity. By folding the resonator cavity, the longitudinal axis of the resonator can be made substantially normal to a transverse or lateral side of a block of laser material, instead of being parallel to the sides, so that the resonator cavity can be pumped longitudinally at a number of spaced intervals along the sides instead of merely from a end.

Figure 1:
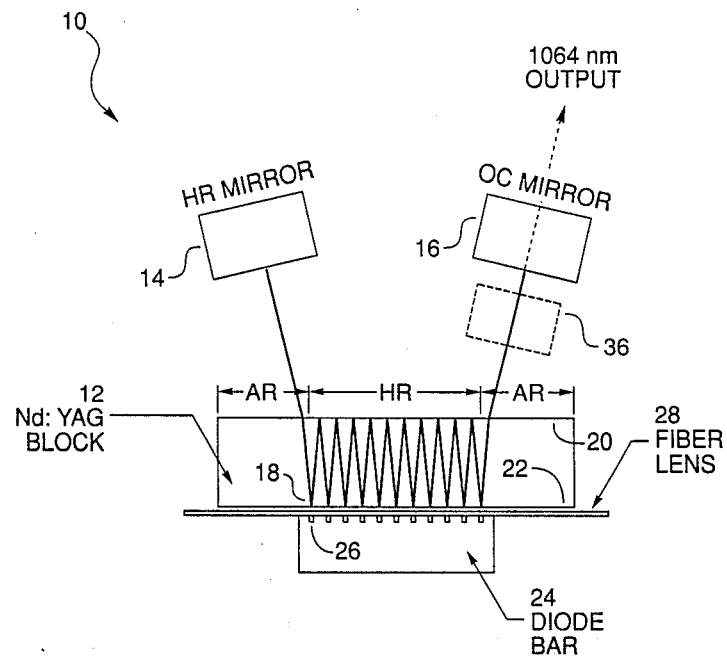
FIG. 1 is a top plan view of a transverse diode bar pumped mode-matched solid-state laser.

A solid-state laser 10, and shown in FIG. 1, is formed with a block 12 of Nd:YAG or other solid-state laser material. Laser cavity forming means, e.g., a mirror 14 which is highly reflective to the laser radiation and an output coupler mirror 16 which is partly transmissive to the laser radiation are positioned around the block 12 to form a laser cavity which extends within the block 12. The mirrors 14, 16 are oriented at angles to block 12 so that the resonant cavity configuration within block 12 is a tightly folded zig-zag 18 at a preselected fold angle between a pair of opposed lateral sides 20, 22 of block 12. As illustrated, mirrors 14, 16 are on the same side of block 12 but can also be on opposite sides.

The surfaces of sides 20, 22 are coated with a suitable anti-reflection (AR) coating; further coating layers which form a high reflectively (HR) coating are placed on the portions of sides 20, 22 where the laser beam is to be reflected back into block 12. As shown, the region of side 20 between the two entrance/exit points of the laser beam has an HR coating, while all of side 22 could have an HR coating. The coatings are further described herein. Diode bar 24, placed along side 22, forms the pumping source. Diode bar 24 contains a plurality of separate laser diode array 26 spaced along its length. The emissions from laser diode arrays 26 on bar 24 are matched to the mode volume of laser 10 by means of a fiber lens collimator 28 and by selecting the fold angle of the zig-zag portion 18 of the resonator to match the divergence of diode arrays 26, as will be further explained below. An optional intra-cavity element 34 may also be included, as described herein. In some cases, collimator 28 may be unnecessary; diode arrays 26 could be butted against block 12.

Figure 2:
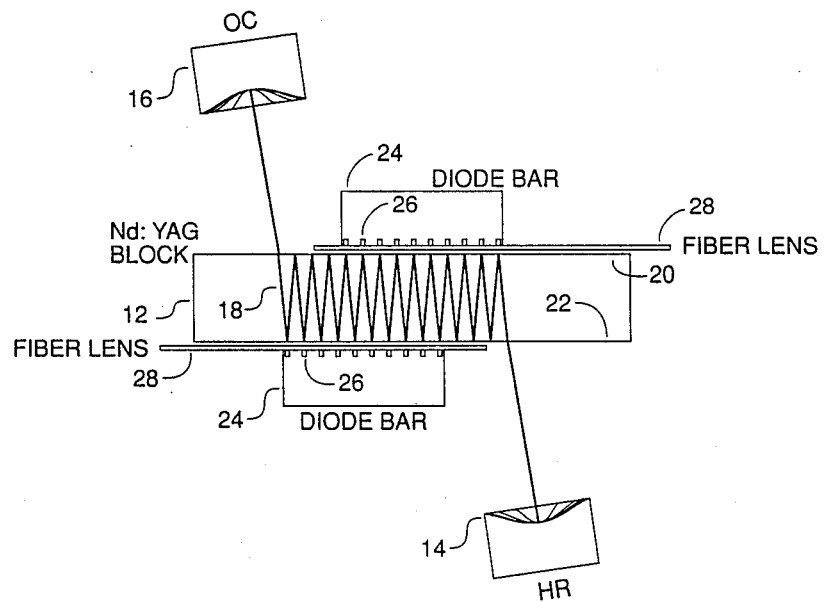
FIG. 2 is a top plan view of a mode-matched solid-state laser pumped transversely by a pair of laser diode bars.
Figure 3A:
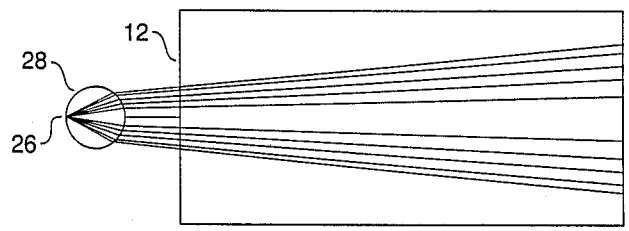
FIGS. 3A-E are ray tracing diagrams of the collimation of a laser diode bar at various distances from a fiber optic collimator.
Figure 3B:
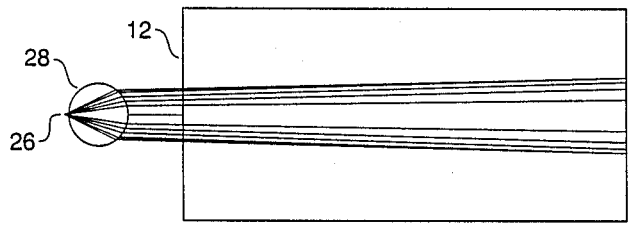
Figure 3C:
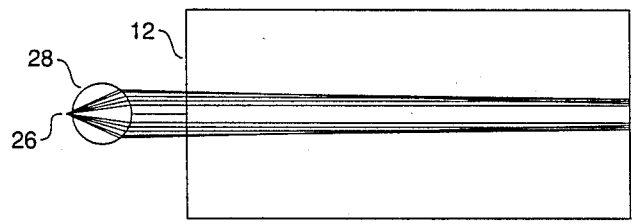
Figure 3D:
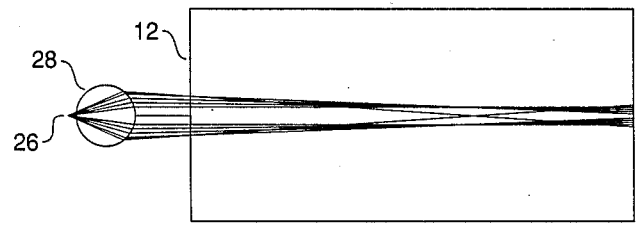
Figure 3E:
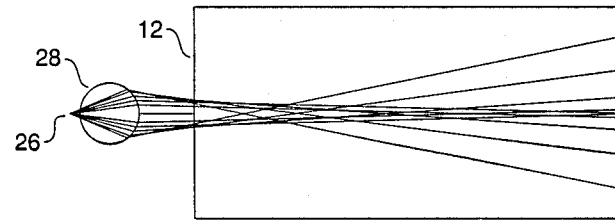

A variation of the basic embodiment which uses a pair of diode bars to pump the solid-state laser is shown in FIG. 2. A separate diode bar 24 is placed along each side 20, 22 of block 12 of laser material to pump the zig-zag portion 18 of the resonator within block 12. Highly reflective mirror 14 and output coupler 16 are on opposite sides of block 12 to form the resonant cavity and are oriented to produce the desired fold angle. Each diode bar has a plurality of separate diode arrays 26 which are collimated by a fiber lens 28.

Many different embodiments of the basic elements are possible; one, two, three or more diode bars can be used, with the bars on one side or both sides of the block of laser material. The cavity forming mirrors can be on the same or opposite sides of the block. Each fold in the resonator can be pumped by a laser diode array, or only every other fold, or every third fold, etc.; the folds can be pumped from only one side or from both sides.

The great advantage of this resonator configuration is that the pump volume can be very closely matched to the mode volume in the resonator. The positions and shapes of mirrors 14, 16 will determine the mode volume within the resonator; TEM00 mode is highly desirable because of its single lobe pattern. The resonator configuration allows a plurality of discrete pumping sources, preferably separate diode arrays, spaced along a multi-element diode bar, to be placed along a lateral side or a pair of opposed lateral sides so that a much greater portion of the laser gain medium can be pumped, and to maximize the efficiency by matching the pumping volume of all the diode arrays to the desired mode volume of the resonator. The result is a configuration of very high efficiency and very high gain.

A preferred embodiment of the laser diode bars has ten one-watt diode arrays located on a 1 cm piece of GaAs. The individual arrays are 200 microns wide and are spaced 1 mm apart. These diode bars are preferred because (1) all the diode laser wavelengths on the bar will be closely matched since they are manufactured on the same monolithic piece of GaAs, (2) spacing the diodes 1 mm apart reduces thermal loading of the substrate, and (3) combining many diodes on a bar reduces packaging cost and improves yields. However, different arrangements of diode bars can be utilized, e.g., different number or spacing of the individual arrays. Alternatively, in place of a diode bar containing many discrete arrays, a plurality of separate individual diode arrays could be positioned along the side of the block. The diode arrays often have a two lobe pattern with a greater divergence in the direction normal to the plane of the bar; the divergence is typically about 7° full angle in the plane of the bar (lobe to lobe) or a numerical aperture (N.A.) of about 0.15, and 28° or 0.6 N.A. in the plane normal to the bar. Thus matching the pump beam to the mode volume in the direction normal to the plane of the bar is more difficult and requires some additional optics.

A preferred embodiment to collimate the output of the diode bar uses an optical fiber as a cylindrical lens. A typical resonator configuration has a 200-300 micron wide beam; therefore a 300-400 micron cylindrical lens would be suitable. Typical multimode optical fibers have this diameter and will form a good low cost collimator provided the fiber can be positioned in a manner that will collimate all the individual spaced arrays. Thus although a fiber could be used to collimate a single array, it is necessary to provide a means for using a fiber to collimate the whole bar. FIGS. 3A-E show the collimation of the output of a laser diode array 26 by an optical fiber 28 into a solid-state laser block 12. The diode arrays 26 are spaced at 1, 10, 20, 30 and 50 microns, respectively, from fiber 28 of about 250 microns diameter. At 1, 10 and 50 microns spacing the beam is not sufficiently collimated. Thus, in order to use an optical fiber to collimate the arrays on a diode bar, the fiber must be held at a spacing of 30±10 microns (i.e. about 20-40 microns) along the entire bar.

Figure 4:
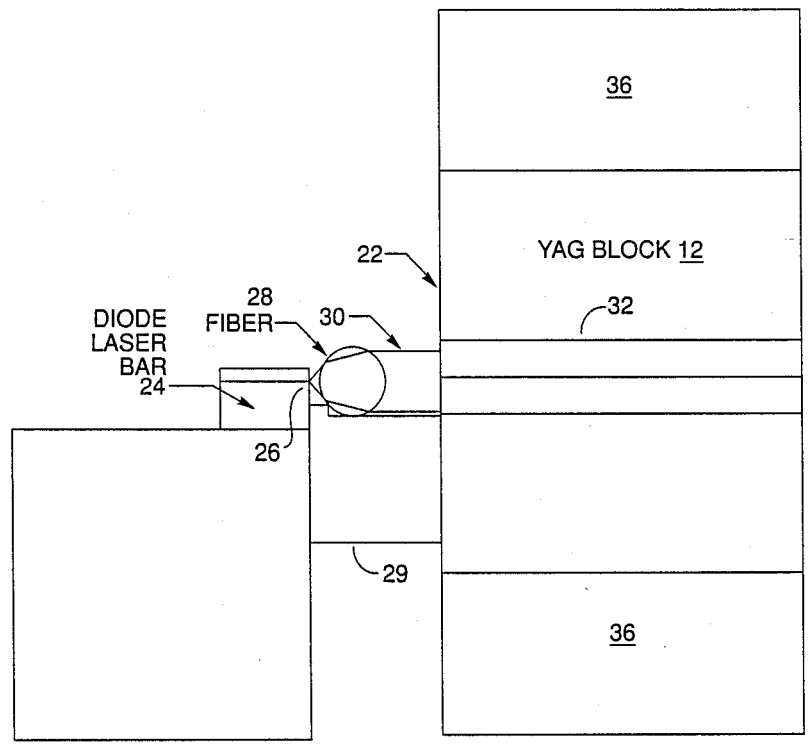
FIG. 4 is an end view of a laser diode bar with fiber optic collimator.

As shown in FIG. 4, an optical fiber 28 is mounted in a spaced relationship with diode bar 24 s that the output from each laser diode 26 is substantially collimated to a pump beam 30 which is incident into lateral side 22 of YAG block 12. Side 22 has a coating which is highly transmissive to the pump radiation (typically about 800 nm) but reflective to the laser radiation. The diameter of fiber 28 is chosen to produce a pump beam 30 with a diameter which substantially matches (is slightly smaller than) the diameter of the laser beam 32, thereby mode matching the pump beam to the mode volume in one direction (normal to the plane of the resonator). The fiber 28 is positioned relative to the diode bar 24 by means of a precision spacing means 29, e.g., a copper heat sink with steps, with diode array 26 at the focus so the radiation will be collimated. Precision spacing means 29 maintains fiber 28 in a precise parallel spaced relationship with bar 24 along its entire length to collimate the output of all the arrays 26 into a line of light. Typically the gap between the diode bar and fiber is about 20-40 microns and the distance between the diode bar and YAG block is about 450 microns. Although an optical fiber is not a perfect collimator because of spherical aberration which causes beam spread, the pump energy will be absorbed in a relatively short distance within the laser medium (an absorption length) so that the spread is negligible and the optical fiber is a highly effective collimator when it is correctly positioned in the manner described. This collimated laser diode bar in itself is also considered a part of the invention.

Figure 5:
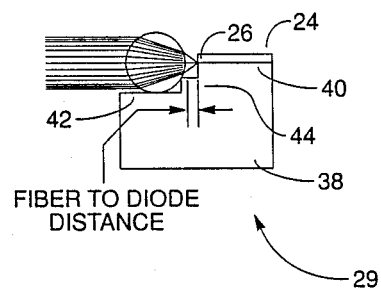
FIG. 5 is an end view of a fiber-optic collimated laser diode bar.
Figure 6:
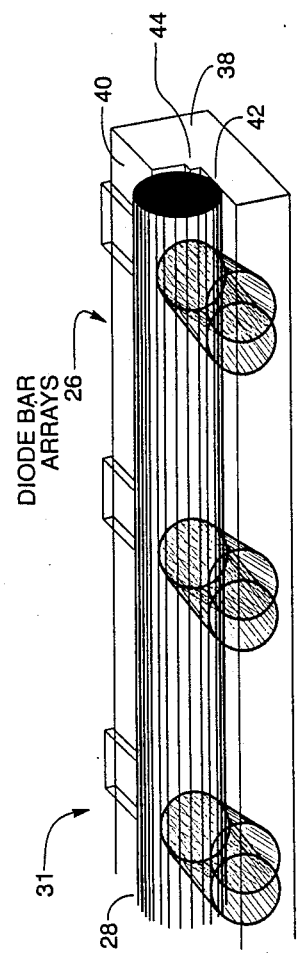
FIGS. 6 and 7 are perspective views of two embodiments of a fiber-optic collimated laser diode bar.
Figure 7:
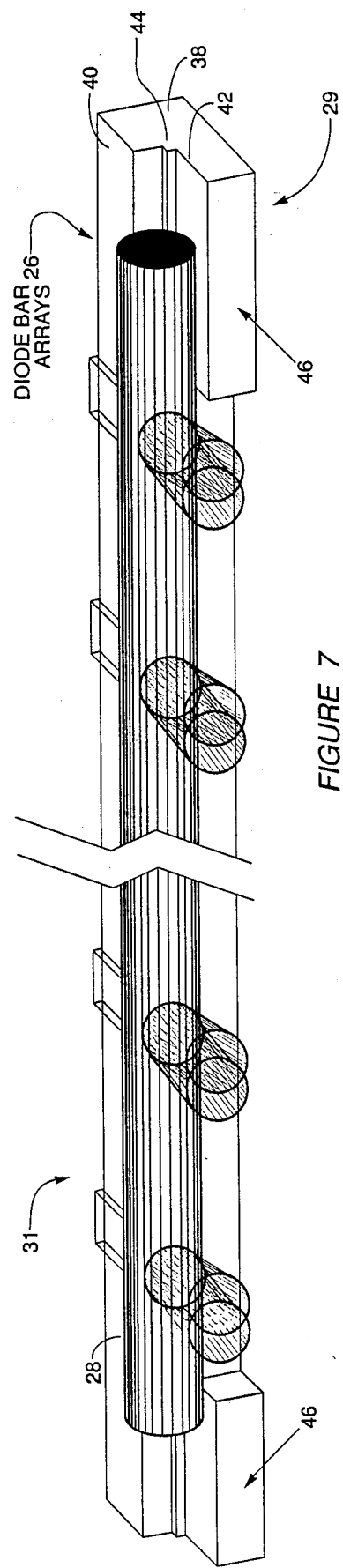

A preferred embodiment of a fiber optic collimated laser diode bar 31 is illustrated in FIG. 4. The spacing means 29 is formed of a multi-step copper or other heat sink 38. The diode bar 24 which contains arrays 26 is mounted on one step 40 while the fiber 28 is mounted (e.g. epoxied) onto a lower step 42. Steps 40 and 42 are separated by an intermediate step 44 against which the fiber 28 is positioned to maintain the correct fiber to diode working distance (about 30 microns) along the length of bar 24 (about 1 cm). The fiber diameter is typically about 250-350 microns, or other suitable multimode fiber diameter depending on the mode volume, to collimate the arrays. A pair of embodiments of the collimated laser diode bar of FIG. 5 are shown in FIGS. 6 and 7. In FIG. 6 the steps 42, 44 for mounting the fiber 28 are formed along the entire length of spacer 29 (heat sink 38) while in FIG. 7 the steps 42, 44 are formed only at the ends 46 of spacer 29. The diode arrays 26 are formed or mounted on step 40. Pump beams 30 from arrays 26 are collimated in one direction but still have two lobe divergence in the other. An alternate method of precision spacing the fiber from the diode bar is to use UV curing epoxy to space the fiber, and to apply the UV when the collimation is acceptable. Any precision spacer or adjustment means which can maintain end-to-end variation of ± 10 microns along the bar length (1 cm) can be used.

Figure 8:
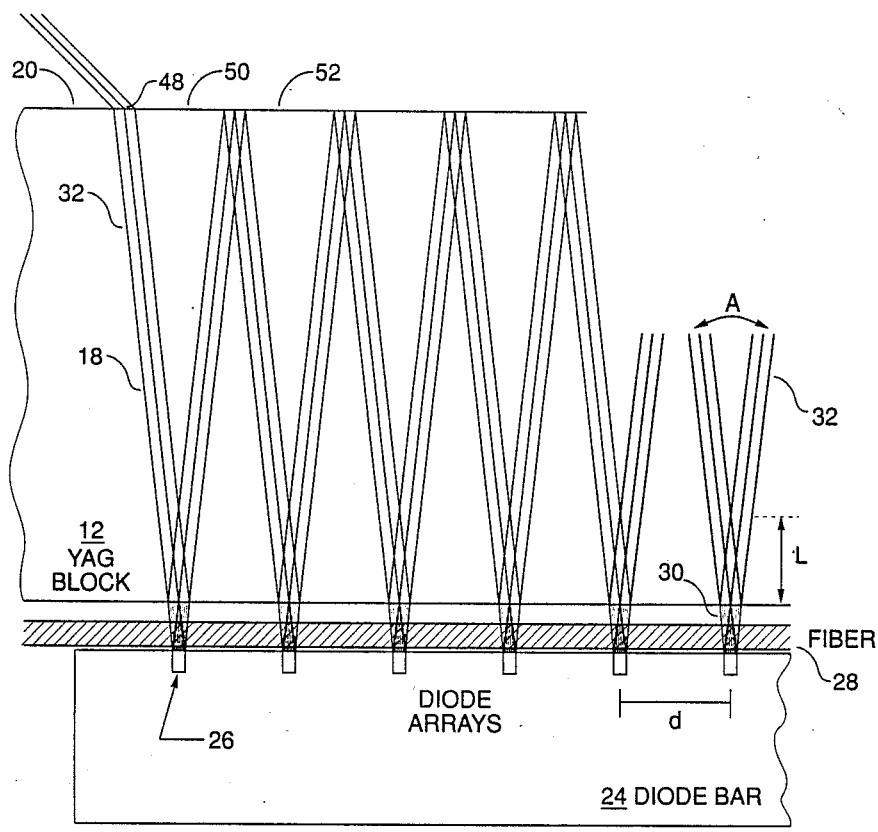
FIG. 8 is a top plan view of a plurality of diode arrays matched to the mode volume in a solid-state laser cavity having a tightly folded zig-zag configuration.
Figure 9:
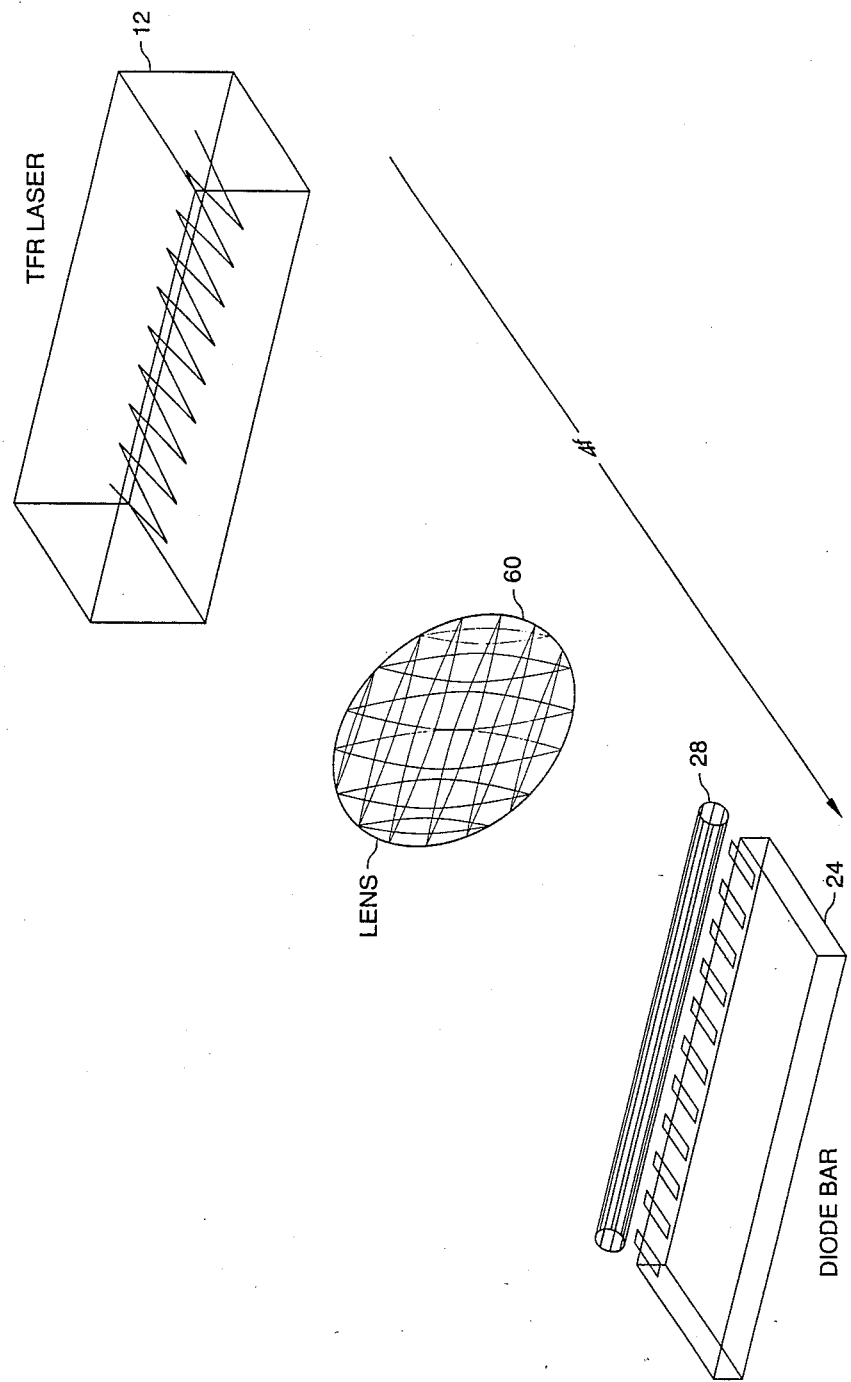
FIG. 9 is a perspective view of an embodiment of the present invention wherein the diodes are separated from the block of laser material and focused thereon using a lens.
Figure 10:
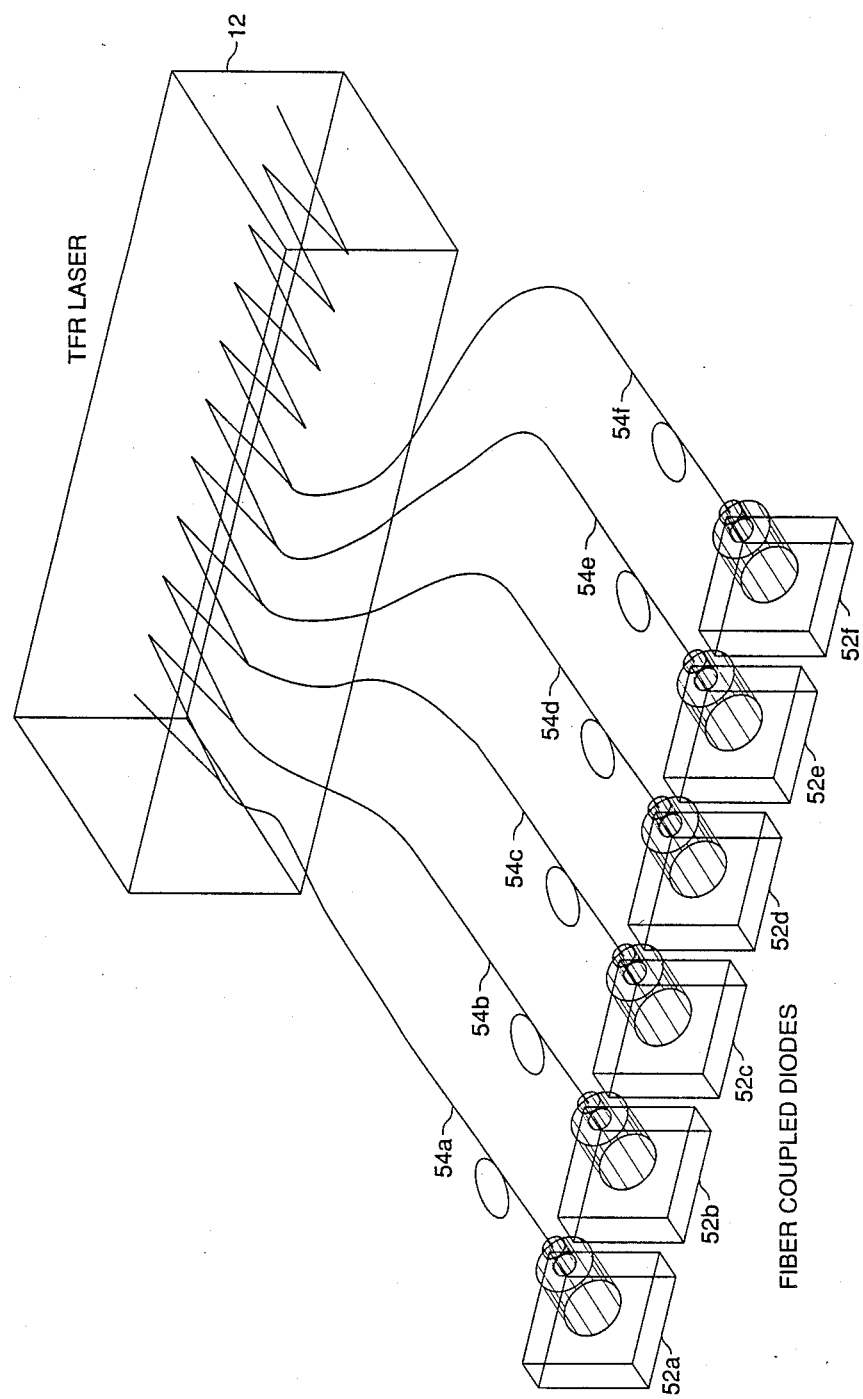
FIG. 10 is a perspective view of an embodiment of the present invention wherein a plurality of diodes are optically coupled to the vertices of the cavity zig-zags within the bar of laser material by optical fibers.

Once the pump beam is mode-matched in one direction, as previously described, it must also be matched in the other direction (in the plane of the resonator). As shown in FIG. 8, the individual diode arrays 26 are separated by a distance d, preferably 1mm, on diode bar 24. Pump beam 30 is collimated by fiber 28 in the direction normal to the resonator plane so the pump beam width in that direction is slightly smaller than the width of the laser beam 32. In the plane of the resonator, the mode volume in the tightly folded portion 18 of the resonator is matched to the divergence of diode arrays 26. Frequently, the diode arrays produce a two lobe output so that one lobe goes into each portion of the V in the folded beam. The mode matching is accomplished by controlling the fold angle A. The diameter of laser beam 32 is typically about 300 microns. The resonator geometry and beam mode volume must be such that the beams in the folds do not overlap, so that the laser beam can exit the block of laser material at the edge of the highly reflective coating on the block surface. The fold angle A should be very steep. It is less than 20°, preferably less than 10° and may typically be 5°. The configuration is totally different from the conventional zig-zag slab laser in which the zig-zag is produced by total internal reflection (TIR) of the beam; in the present invention the fold angle is too steep for TIR. The laser diode beam may be single lobe, e.g., as produced by the Sony extended emitter laser diodes. Accordingly it is desirable to produce a folded zig-zag configuration where the distance L at which the beam 32 does not overlap between the V (i.e. the two parts of the V totally separate) is equal to or greater than the absorption length of the pump beam radiation in the particular laser medium. Therefore, the fold angle will depend on the diode array spacing and ability to remove the beam from the zig-zag portion of the resonator. The diodes need not pump every single fold, but may pump every other fold. The fold angle can be made very steep, particularly in the case of a single lobe pump beam so that the pump beam direction most closely coincides with the longitudinal axis of the laser beam in the region of the laser beam where the pump radiation is absorbed by the gain medium. The fold angle is adjusted, by means of the cavity forming means, to follow out the intensity distributions of the pump source with the TEMOO mode and maximize overlap.

A number of different factors must be considered to design the cavity, as illustrated by the following preferred embodiment. First is the block of laser material. A YAG bar 5mm x 5 x 20 mm can be produced, machined flat to half a wavelength over the whole length. Thus the length of the folds (distance between the two lateral sides) will typically be about 5mm. Next is the laser beam mode volume. The radius of the cavity forming mirrors is typically 100 cm, and the mirrors are placed about 2 cm from the laser block. With ten folds (20 passes across the block) the total cavity length is about 15 cm, and has a $1/e^2$ beam diameter of about 300 microns. A 300 micron beam is desirable because the diode arrays are 200 microns and can be matched to the mode volume for maximum pumping efficiency. However changing the cavity (mirror radius) can produce other beam sizes which may be suitable in other embodiments, e.g. if a 0.5cm diode bar is used with ten 0.5 W arrays of 100 micron diameter (also with a suitable narrower fiber collimator).

In order to remove the beam from the block, the beam must pass through a region that is not reflecting (i.e. only AR coated) and skim by a region that is highly reflecting (HR coated). As a general rule, to avoid significant diffraction losses, the aperture must be about 3 times the $1/e^2$ beam diameter to avoid significant diffraction loses. Thus for a TEMOO beam diameter of 300 microns, the nearest edge must be about 500 microns. As shown in FIG. 8, beam 32 exits side 20 at point 48. The distance between folds is about 1mm. Thus point 50 which is directly across from the first diode array 26 is about 500 microns from exit point 48. Thus the HR coating should end sharply at point 50 so the beam can exit without significant diffraction loss.

The coating method uses a precision mask to match the end to end length of the bar. The mask is very thin, e.g. 2 mils (0.002 in) for a sharp cutoff or steep edge so the beam can exit without significant diffraction loss. The coatings are conventional optical coatings. Both sides are first coated with a AR coating, e.g., two layers which also form the first two layers of the HR coating. Any side on which there are no exit points can be completely coated with a multi-layer (e.g. 20 layer) HR coating. The central portion of the other sides is then coated with the HR layers using the mask.

A potential problem because of the high gain is the occurrence of parasitic oscillation straight across the laser medium block from the diode array, i.e. between the zig-zag folds. One solution is to coat the block surface in a series of HR stripes so the surface coating where the zig-zag folds contact the surface are highly reflective but the surface directly across from the diode array is only AR coated to create a window which will not produce resonance. The point 52 (and similar points at each fold), shown in FIG. 8, which is directly across from an array 26 should not be HR but only AR coated. This could be produced by using a coating mask which forms stripes of HR coating only where the beam reflects and leaves gaps in the HR coating (i.e. only AR coating) at points 52 (the HR coating would also be moved slightly off point 50 at the exit point). Alternatively, the entire surface beneath the mask could be HR coated and then stripes of HR coating could be removed at points 52, e.g. by a laser. Another solution is to slightly wedge the normally parallel opposed sides of one laser block; however, this may require nonuniform spacing of the diodes to compensate.

The lasers according to the invention represent a major advance in ability to effectively pump a solid-state laser using a high power diode bar pump source by mode matching to the desired TEMOO mode volume. These lasers can be made extremely compact and have very high performance characteristics. Any of the wide variety of solid-state laser materials can be used; in particular Nd: YAG and Nd:glass are two well-known materials which have been extensively used for other applications. In general, the active medium should have high slope efficiency, broad pump bands, and good thermal conductivity. A Nd: YAG laser has a very strong line at 1.06 microns and weaker lines at 0.946 and 1.3 microns, all in the IR. For operation in the visible, a frequency doubler could be added to the laser cavity, represented by intracavity element 34 in FIG. 1, producing 532 nm, 473 nm and 651 nm, respectively. Power levels of 10 W at 1.06 microns are attainable with a 3 bar pump (5 W at 532 nm). The laser has a very high CW gain; e.g., if the gain in each fold is 10–20%, a total gain of about 7–8 can be achieVed. Operation is CW or Changes and modifications in the specifically described embodiments can be carried out without departing from the scope of the invention which is intended to be limited only by the scope of the appended claims

What is claimed is:

1. A mode-matched diode-pumped solid state laser, comprising:
   a block of laser material having a pair of opposed sides,
   cavity forming means positioned around the block to define a laser cavity having a tightly folded zig-zag resonator portion within the block between the opposed sides having vertices at a preselected fold angle,
   a plurality of laser diode pumping sources separated from said block of laser material,
   a lens for focusing radiation from the laser diode pumping sources onto at least one of the opposed sides of the block of laser material so as to substantially align the radiation from said laser diode pumping sources with the vertices of the zig-zag portion of the resonator,
   said fold angle being greater than about 5° and less than about 20° and selected to substantially match the mode volume with pump radiation from said laser pump sources.

2. The laser of claim 1 wherein the cavity forming means comprise a highly reflective mirror and a partially transmissive output coupler mirror, and a high reflective coating along a portion of the opposed sides.

3. The laser of claim 1 wherein said laser diode pumping sources comprise a laser diode bar containing of plurality of separate laser diode arrays.

4. The laser of claim 1 further including collimating means for collimating the output of said laser diode pumping sources.

5. The laser of claim 4 wherein said collimating means is an optical fiber.

6. The laser of claim 1 wherein the mode volume is TEMOO.

7. The laser of claim 1 wherein the laser material is Nd:YAG.

8. The laser of claim 1 further including a frequency doubler positioned in the cavity.

9. The laser of claim 1 further including a Q switch positioned within the cavity.

10. The laser of claim 1 further including precision spacing means for holding the fiber in a precise space relationship to the pump sources.

11. The laser of claim 1 wherein the block is about 5mm wide and, the mode volume is about 300 microns in diameter.

12. The laser of claim 10 wherein the pumping sources is a laser diode bar of 1cm length containing 10 1W diode arrays each 200 microns wide.

13. A mode-matched diode pumped solid state laser, comprising:
   a block of laser material having a pair of opposed sides,
   cavity forming means positioned around the block to define a laser cavity having a tightly folded zig-zag portion within the block between the opposed sides having vertices at a preselected fold angle,
   a plurality of laser diode pumping sources,
   a plurality of optical fibers, each of said optical fibers optically coupled at one end to one of said laser diode pumping sources and optically coupled at the other end to at least one of said opposed sides of said block of laser material and substantially aligned with on of the vertices of the zig-zag portion of the resonator,
   said fold angle being greater than about 5° and less than about 20°, and selected to substantially match the mode volume with pump radiation from said laser diode pump sources.

14. The laser of claim 13 wherein the cavity forming means comprise a highly reflective mirror and a partially transmissive output coupler mirror, and a highly reflective coating along a portion of the opposed sides.

15. The laser of claim 13 wherein said laser diode pumping sources comprise a laser diode bar containing a plurality of separate laser diode arrays.

16. The laser of claim 13 further including collimation means for collimating the output of said laser diode pumping sources.

17. The laser of claim 16 wherein said collimating means is an optical fiber.

18. The laser of claim 13 wherein the mode volume is TEMOO.

19. The laser of claim 13 wherein the laser material is Nd:YAG.

20. The laser of claim 13 further including a frequency doubler positioned in the cavity.

21. The laser of claim 13 further including a Q-switch positioned within the cavity.

22. The laser of claim 13 further including precision spacing means for holding the fiber in a precise spaced relationship to the pump sources.

23. The laser of claim 13 wherein the block is about 5 mm wide and, the mode volume is about 300 microns in diameter.

24. The laser of claim 13 wherein the pumping sources is a laser diode bar of 1 cm length containing ten 1 W diode arrays, each 200 microns wide.

25. A mode matched diode pumped solid state laser, comprising:
   a block of laser material having a pair of opposed sides,
   cavity forming means positioned around the block to define a laser cavity having a tightly folded zig-zag resonator portion within the block between the opposed sides having vertices at a preselected fold angle,
   a plurality of laser diode pumping sources optically coupled to at least one of the opposed sides of said block and substantially aligned with the vertices of the zig-zag portion of the resonator such that radiation from said pump sources radiates one or more of said vertices,
   said fold angle being greater than about 5° and less than about 20°, and selected to substantially match the mode volume with pump radiation from said laser diode pump sources.

26. The laser of claim 25 wherein the cavity forming means comprise a highly reflective mirror and a partially transmissive output coupler mirror, and a highly reflective coating along a portion of the opposed sides.

27. The laser of claim 25 wherein said laser diode pumping sources comprise a laser diode bar containing a plurality of separate laser diode arrays.

28. The laser of claim 25 further including collimation means for collimating the output of said laser diode pumping sources.

29. The laser of claim 28 wherein said collimating means is an optical fiber.

30. The laser of claim 25 wherein the mode volume is TEMOO.

31. The laser of claim 25 wherein the laser material is Nd:YAG.

32. The laser of claim 25 further including a frequency doubler positioned in the cavity.

33. The laser of claim 25 further including a Q-switch positioned within the cavity.

34. The laser of claim 25 further including precision spacing means for holding the fiber in a precise spaced relationship to the pump sources.

35. The laser of claim 25 wherein the block is about 5 mm wide and, the mode volume is about 300 microns in diameter.

* * * * *